United States Patent [19]

Koike et al.

[11] Patent Number: 4,901,011
[45] Date of Patent: Feb. 13, 1990

[54] CARRIER FOR TRANSFERRING PLATE-LIKE OBJECTS ONE BY ONE, A HANDLING APPARATUS FOR LOADING OR UNLOADING THE CARRIER, AND A WAFER PROBING MACHINE FITTED WITH THE HANDLING APPARATUS FOR THE WAFER CARRIER

[75] Inventors: Hisashi Koike, Yamanashi; Sumi Tanaka, Kofu, both of Japan

[73] Assignee: Tokyo Electron Limited, Tokyo, Japan

[21] Appl. No.: 267,375

[22] Filed: Nov. 4, 1988

[51] Int. Cl.$^4$ ............................................. G01R 31/26
[52] U.S. Cl. .................................. 324/158 F; 414/416
[58] Field of Search ........................ 324/158 F; 437/8; 361/212; 414/217, 416, 786, 463

[56] References Cited

U.S. PATENT DOCUMENTS

| | | | |
|---|---|---|---|
| 4,534,389 | 9/1985 | Tullis | 414/217 |
| 4,755,746 | 8/1988 | Mallory et al. | 324/158 F |
| 4,759,008 | 8/1988 | Hirano et al. | 369/75.2 |
| 4,797,865 | 1/1989 | Imai et al. | 369/39 |

Primary Examiner—Reinhard J. Eisenzopf
Assistant Examiner—Edward Urban
Attorney, Agent, or Firm—Oblon, Spivak, McClelland, Maier & Neustadt

[57] ABSTRACT

A carrier for transferring a semiconductor wafer one by one includes a tray portion to load the wafer thereon the wafer submitted for processing, the tray portion having a groove which is formed therein for unloading the wafer therefrom, and mechanism for positioning the tray portion relative to a predetermined location of the drawer. A handling apparatus for the carrier includes a sampling case mounted to the frame of a wafer probing machine and having formed therein a first opening communicating with the outside of the machine and a second opening communicating with the interior of the machine, a drawer adapted to go into and come out of the case through the first opening and plural pairs of guide-rollers to guide the drawer between the first and second openings of the case. To take a sample from among the wafers in the machine, the carrier is loaded on the drawer, the carrier held on the drawer is pushed through the second opening into the case, wafer is picked out by a full-automatic transferring apparatus from a wafer storage, the wafer is inserted through the second opening into the case, the wafer is placed on the carrier by guiding it through the groove of the carrier and the drawer is pulled out.

17 Claims, 4 Drawing Sheets

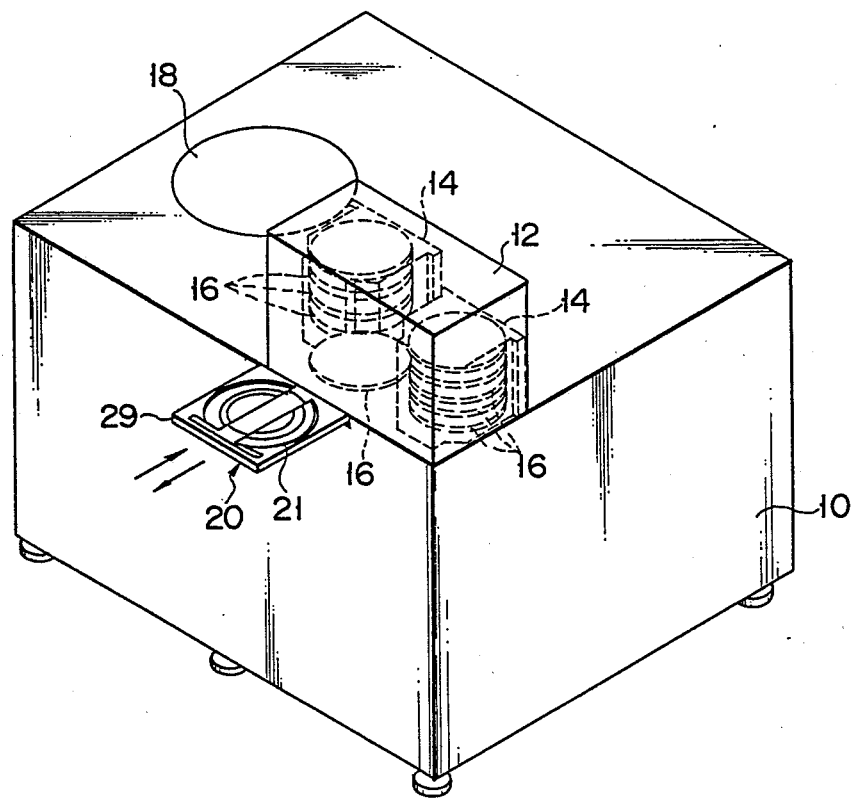
F I G. 1

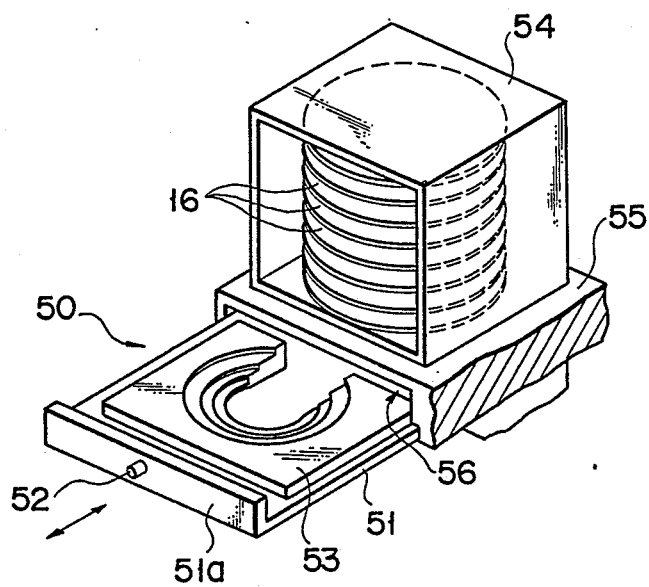
F I G. 6

CARRIER FOR TRANSFERRING PLATE-LIKE OBJECTS ONE BY ONE, A HANDLING APPARATUS FOR LOADING OR UNLOADING THE CARRIER, AND A WAFER PROBING MACHINE FITTED WITH THE HANDLING APPARATUS FOR THE WAFER CARRIER

BACKGROUND OF THE INVENTION

1. Field of the Invention

This invention relates to a single-piece-transfer type carrier for transferring plate-like objects such as semiconductor wafers or liquid crystal display elements, one by one from one place to another. It also relates to a handling apparatus of a carrier for transferring plate-like objects such as semiconductor wafers, one by one, to and from an apparatus for inspection, processing or the like. Further, this invention relates to a probing apparatus, equipped with a carrier handling apparatus capable of sampling plate-like objects such as semiconductor wafers, one by one, as necessity requires.

2. DESCRIPTION OF THE RELATED ART

Generally, in the manufacturing process of semiconductor devices such as ICs and LSIs, a number of semiconductor wafers are accommodated in a wafer cassette and are transferred contained in the cassette from apparatus to apparatus, and from one process to another.

In a full-automatic probing machine for testing wafers, for example, a special-purpose handling apparatus takes wafers out, one by one, from a wafer cassette set in the loading/unloading section. Then, the wafer is subjected to pre-alignment, placed on the main chuck of the testing section and receives a probing test. After the test is finished, the wafer is taken back by the full-automatic transferring apparatus and returned to a wafer cassette.

In other words, in the full-automatic wafer probing machine, semiconductor wafers are taken out one after another from wafer cassettes and put back into the cassettes without the operator directly touching the wafers by hand.

With conventional full-automatic wafer probing machines, wafers cannot be taken out without opening the machine. These conventional wafer probing machines are suitable for mechanically processing a large quantity of semiconductor wafers, but they have difficulty in handling individual wafers. When taking out individual wafers for manual measurement or picking out a single sample from among many wafers using a conventional wafer probing machine, the operator has to take a wafer out with forceps (tweezers).

In the manual transfer of wafers to a subsequent process, the operator needs to exert his power of concentration and must be skilled in the work. Even though he exercises due care in manual transfer, it sometimes occurs that a wafer is damaged when it slips off forceps or collides with something else.

SUMMARY OF THE INVENTION

An object of this invention is to provide a wafer carrier which can transfer wafers one by one, without the assistance of human labor.

A further object of this invention is to provide a wafer carrier which can load and unload wafers, one by one, to and from an apparatus, thereby performing sampling or other special handling of the wafers.

A still further object of this invention is to provide a wafer probing machine fitted with a loading/unloading apparatus, for a wafer carrier, which is capable of safely taking samples of wafers one by one without damaging wafers, when there is a need to do sampling or other special handling of the wafers.

According to an aspect of the present invention, a carrier for transferring plate-like objects one by one comprises, a tray means, made of a material having a low conductivity for loading thereon the plate-like object to be submitted for processing, said tray means having a groove which is formed therein for unloading the plate-like object therefrom, and means for positioning said tray means relative to a predetermined location of a given handling apparatus.

The handling apparatus for loading or unloading a carrier transferring plate-like objects one by one comprises, a sampling case mounted to the frame of an apparatus for processing plate-like objects and having formed therein a first opening communicating with the outside of a given processing apparatus and also a second opening communicating with the interior of the given processing apparatus, a drawer provided so as to go into and come out of said sampling case through the first opening thereof, means for guiding said drawer between the first and the second opening of said sampling case and a carrier that holds one plate-like object at a time, said carrier made of a material having a low conductivity, comprising a tray means for loading thereon the plate-like object to be submitted for processing, said tray means having a groove which is formed therein for unloading the plate-like object therefrom, and means for positioning said tray means relative to a predetermined location of a given handling apparatus, said carrier being configured such that only the plate-like object being processed is carried into the interior of the processing apparatus through the second opening when the plate-like object being processed is held in the carrier and inserted through the first opening into said sampling case.

The plate material probing machine fitted with a handling apparatus for loading or unloading the carrier, comprises a testing section where a multitude of probes are brought into contact with the pads of a device circuit of a semiconductor wafer to pass an electric current to the device circuit under test, a loading/unloading section provided adjacent to the testing section and used to take semiconductor wafers into and out of the testing section, and means for transferring semiconductor wafers between the loading/unloading section and the testing section. The probing machine fitted with the loading/unloading apparatus for the carrier, also includes a sampling case mounted to the loading/unloading section and having formed therein a first opening communicating with the outside of the loading/unloading section and a second opening communicating with the interior of the loading/unloading section, a drawer adapted to go into and come out of the sampling case through the first opening, means for guiding the drawer between the first opening and the second opening of the sampling case, and the carrier which is loaded on the drawer and used to hold one piece of semiconductor wafer at a time. The carrier has a groove for allowing the semiconductor wafer being processed to be moved in and out. This carrier is configured such that only the semiconductor wafer being processed is carried into the loading/unloading section through the second opening when the semiconductor wafer being processed is inserted on the carrier through the first opening into the sampling case.

The tray means of the carrier preferably have stepped sections constituting a plurality of concentric object-mounting surfaces located at different levels.

The groove of the carrier preferably is extended from a peripheral edge of the tray means to at least the central portion of said tray means. The groove preferably extends lower than the wafer-mounting surface located at the lowest level.

The above-mentioned carrier has positioning means mounted on the reverse side of the tray means (on the side opposite the plate material loading surface). The positioning means should preferably be such that the hole at the center of the taper area on the reverse side of the tray means catches the pin on the drawer, thereby correctly positioning the carrier relative to the drawer.

The positional relation between the first and the second openings of the sampling case may be set in any manner but should preferably be placed against each other.

It is desirable that a stopper is provided in the sampling case whereby the drawer is stopped at a specified position in the case. When the first and the second openings of the case are provided face-to-face with each other, a stopper should be mounted near the second opening. In this case, the stopper is a ballcatch clamp.

In addition, the stopper attached to the case should be provided with a stop position adjusting function to change the stop position of the drawer. In this case, the stopper has a screw and a nut.

For the means for guiding the drawer, it is desirable to adopt guide-rollers less liable to produce dust. In this case, it is desirable to combine a pair of guide-rollers to hold the drawer across the depth and a pair of guide-rollers to hold the drawer across the width.

A recess is formed on the reverse side of the tray means of the carrier and a guide-roller pressurized by a coil spring fits into the recess when the drawer is pulled out.

It is also desirable to provide a stopper at the rear end of the drawer plate to stop the drawer at the drawn-out position as the stopper is held back by part of the case when the drawer is drawn out.

Preferably, a drawer pull should be provided at the front side of the drawer. It is also possible to provide the drawer with a long groove or a projection to serve as a catch.

BRIEF DESCRIPTION OF THE DRAWINGS

FIG. 1 is a perspective view schematically showing a wafer probing machine having a handling apparatus of a wafer carrier according to a first embodiment of this invention;

FIG. 6 is a perspective view showing the handling apparatus of a wafer carrier according to a second embodiment of this invention.

DETAILED DESCRIPTION OF THE PREFERRED EMBODIMENTS

Figure 2:
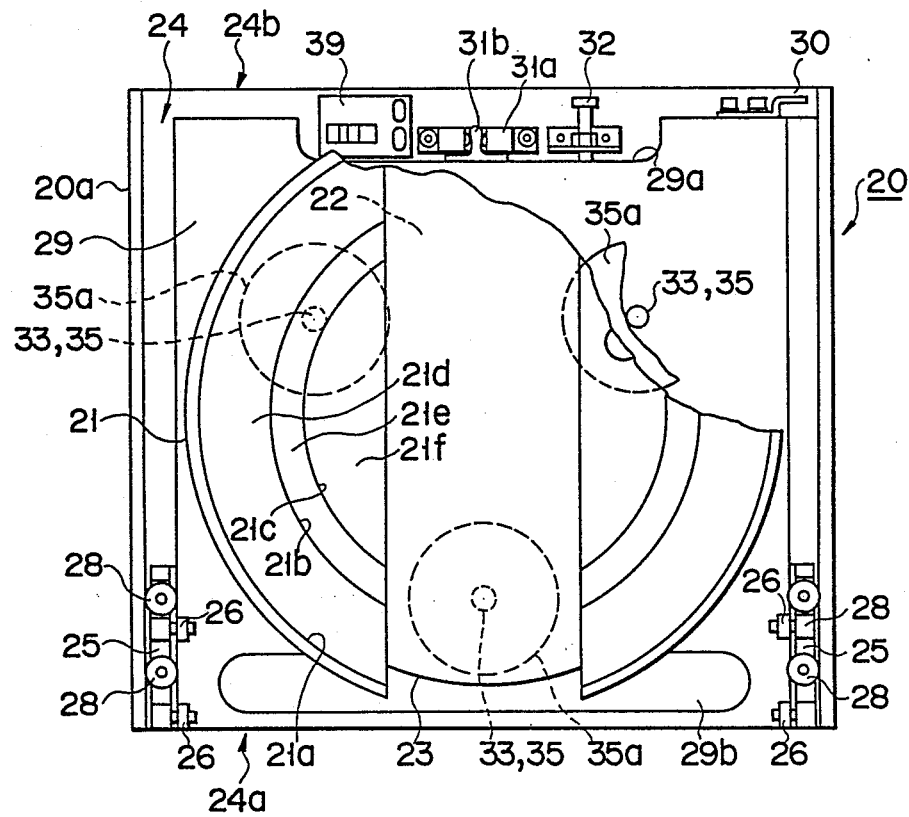
FIG. 2 is a plan view showing the wafer carrier according to the first embodiment of this invention, stored in the wafer carrier handling apparatus.

Various embodiments of this invention, i.e., wafer probing machines, will now be described with reference to the drawings.

As is shown in FIG. 1, wafer storage room 12 is provided on the top surface of wafer probing machine 10. A plurality of wafer cassettes 14 are accommodated in storage room 12, and a plurality of silicon wafers 16 are positioned horizontally coaxially in each wafer cassette, spaced apart from one another at predetermined intervals.

Provided in wafer probing machine 10 is a full-automatic transferring apparatus (not shown) to pull out wafers 16 submitted for testing one by one from wafer cassette 14 and return tested wafer 16 to cassette 14. In wafer probing machine 10 comprising a loading/unloading section and a testing section, wafer 16 is transferred by the transferring apparatus from storage room 12 of the loading/unloading section to main chuck 18 of the testing section. Main chuck 18 is supported by each of the X-Y-Z-$\theta$ stages and are moved in the directions of the X, Y, Z and $\theta$ axes.

A probe card (not shown) is placed facing main chuck 18 of the testing section. The probe card has a multitude of probes. When the probes are brought into contact with a multitude of pads to pass an electric current to a circuit of a device pattern, a test signal is detected by a testing machine (not shown). According to the detection signal, the tester makes acceptability judgements backed up by a computer system.

Wafer sampling apparatus (wafer handling apparatus) 20 is under wafer storage room 12. Sampling apparatus 20 is of a drawer type. Drawer 29 of sampling apparatus 20 is provided such that it is drawn out horizontally to the side of wafer probing machine 10. Drawer 29 is loaded with carrier 21 for wafer transfer.

As shown in FIG. 2, drawer 29 of wafer sampling apparatus 20 is accommodated in space 24 defined by square case 20a of a size a little larger than the wafer size. Drawer 29 has at its front a formed recess 29a and at its rear a formed groove 29b for manual operation.

Case 20a is secured to wafer probing machine 10 and has at its front and rear formed first opening 24a and second opening 24b, respectively. To be more specific, wafers are passed through first opening 24a and second opening 24b of case 20a and transferred into the wafer probing machine.

Figure 3:
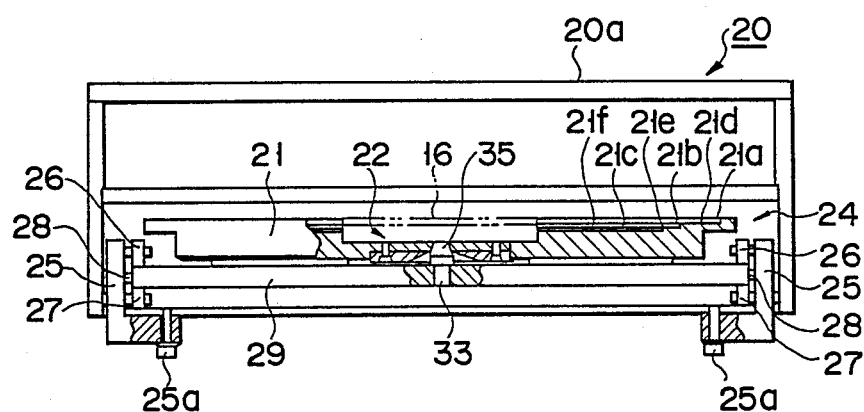
FIG. 3 is a side view showing the wafer carrier according to the first embodiment of this invention stored in the wafer carrier handling apparatus, with some portions cut away to show the interior construction.

As indicated in FIG. 3, brackets 25 are mounted to the inner side walls of first opening 24a of case 20a with bolts 25a. Each bracket 25 has a set of guide-rollers 26, 27 and 28 to allow drawer 29 to slide in case 20a while being regulated from above, below, left and right. Drawer 29 is held at its peripheral areas from above and below by first guide-rollers 26 and 27 and held also at the lateral edges across the width by a couple of second guide-rollers 28.

As can be seen in FIG. 2, mounted close to second opening 24b of case 20a are ball-catch clamp 31a, 31b and stopper 32 to stop drawer 29 when drawer 29 is pushed in. Stopper 32 is of a screw type and used to slightly adjust the stop position of drawer 29. Stopper 32 connects with drawer 29 at recess 29a. When sensor 39, installed near second opening 24b, finds that drawer 29 has been pushed into case 20a, it sends a detection signal to the handling apparatus in the wafer probing machine.

Figure 4:
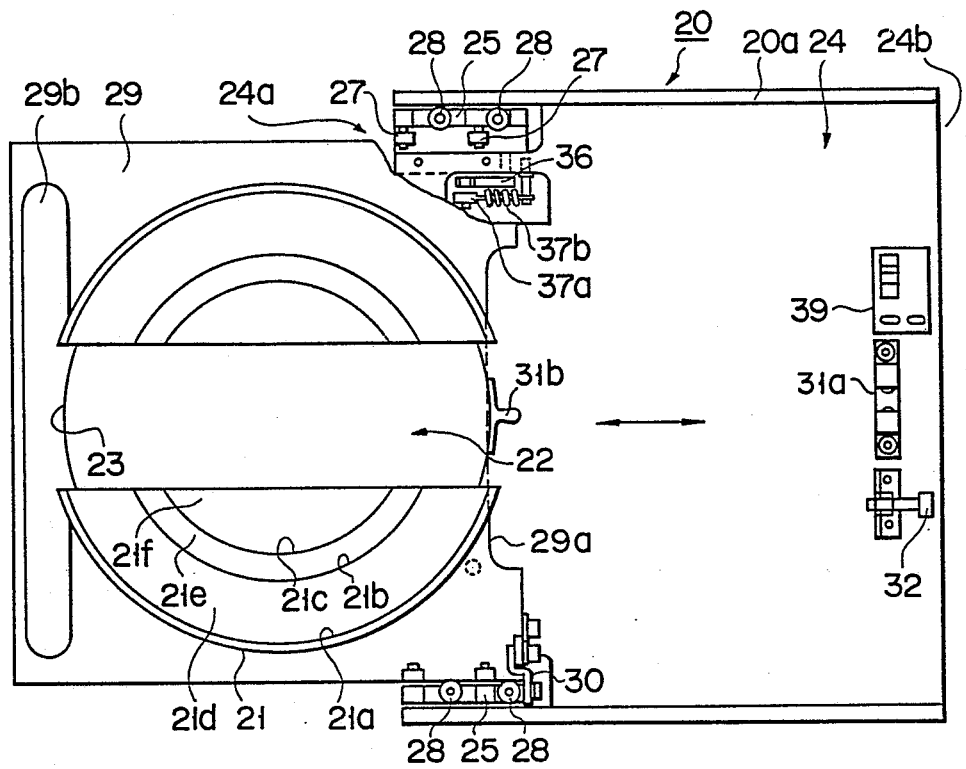
FIG. 4 is a plan view showing the wafer carrier according to the first embodiment of this invention as it has been drawn out from the wafer carrier handling apparatus.

Another stopper 30 is mounted at the front of drawer 29. As shown in FIG. 4, when drawer 29 is drawn out of case 20a, stopper 30 contacts bracket 25 to stop drawer 29.

Figure 5:
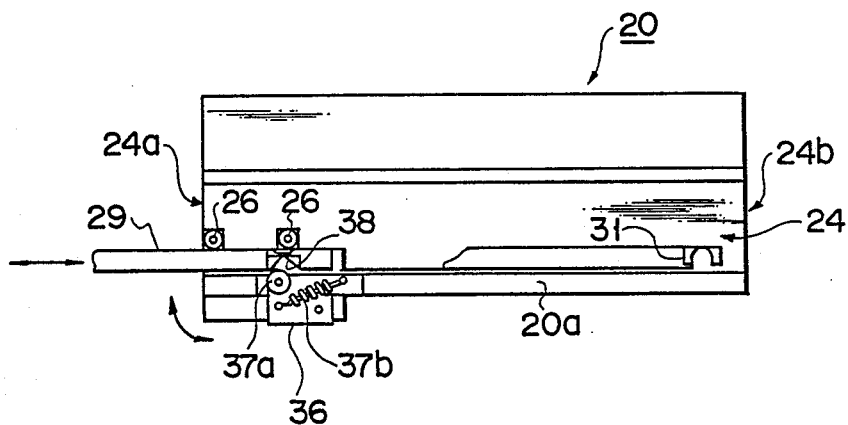
FIG. 5 is a sectional side view showing the drawnout condition of the drawer by cutting away a portion of the handling apparatus of a wafer carrier according to the first embodiment of this invention.

As is clear from FIGS. 4 and 5, roller 37a pressurized by spring 37b is fitted to case 20a by bracket 36 and the face of roller 37a is in contact with the underside of drawer 29. Recess 38, which has been formed in the underside of drawer 29, receives roller 37a which falls thereinto pushed by spring 37b when drawer 29 is drawn out, thereby keeping drawer 29 stably in the drawn-out position.

Next, carrier 21 will be described in greater detail.

Carrier 21 is generally a disc and made of a material having low conductivity. Formed in the upper position of carrier 21 are tray portions (wafer-mounting portions) 21d, 21e and 21f and frame portions 21a, 21b and 21c. Wafers of three different sizes can be loaded on portions 21d, 21e and 21f. The inside diameters of frame portions 21a, 21b and 21c are 200 mm, 150 mm and 125 mm respectively.

Notched groove 22 is formed running through the center of carrier 21 from one end to the opposite end of the peripheral edge of carrier 21. As shown in FIG. 3, groove 22 is formed by notching only the upper part of carrier 21 and the bottom of groove 22 is located in a lower position than the lowest step 21d.

As shown in FIG. 2, three taper slideways 35a each having center hole 35 are formed equally spaced at suitable positions of the lower portion of carrier 21. Taper slideways 35a are in a conical form around center holes 35. When carrier 21 is loaded on drawer 29, pin 33 of drawer 29 is guided by taper slideway 35a into center hole 35, allowing carrier 21 to be placed stably at a specified position on drawer 29, as shown in FIG. 3.

Groove 22 of carrier 21 loaded on drawer 29 extends in the loading/unloading direction of drawer 29, as shown in FIGS. 2 and 4.

A description will now be made of the sampling of wafers 16 using the above-mentioned handling apparatus when it is necessary to do manual measurement of individual wafers 16 in storage room 12.

First, the program in the computer system to control the wafer probing machine is changed from one for routine test to another for sampling and the operation of the full-automatic transferring apparatus (not shown) is changed. Thus, the full-automatic transferring apparatus pulls out one wafer 16 from cassette 14 and inserts wafer 16 through second opening 24b into case 20a. The arm of the transferring apparatus, holding wafer 16, moves along groove 22 of carrier 21. When the center of wafer 16 coincides with the center of carrier 21, the advance of the arm is stopped. The arm is lowered, wafer 16 is transferred from the arm onto carrier 21 and then the arm is withdrawn from inside case 20a. Sensor 39 detects wafer 16 on carrier 21, confirming that wafer 16 is ready to be taken out of case 20a.

The operator now puts his hand through first opening 24a into case 20a and takes hold of groove 29b. As the operator pulls drawer 29 toward him, drawer 29 slides smoothly, guided by guide-rollers 26, 27, 28, and is pulled out on the side of first opening 24a. When drawer 29 is pulled out sufficiently, roller 37a catches recess 38 of drawer 29 and stopper 30 contacts bracket 25. Thus, drawer 29 is stopped. Carrier 21, together with wafer 16, is taken out of drawer 29. Wafer 16 held on carrier 21 is taken by the operator to a machine for individual wafer inspection.

With the wafer carrier according to the above embodiment, wafers can be transferred manually without directly touching them and can be prevented effectively from being contaminated. This wafer carrier is capable of manual transfer of wafers of various sizes ranging from 125 to 200 mm.

With the handling apparatus according to the above embodiment, it is possible to take wafer samples from inside the wafer probing machine without using forceps (tweezers). Therefore, damage of wafers due to a fall or collision can be avoided.

When the probing machine made according to this invention is used, wafers can be transferred from the wafer cassette to the sampling case by the full-automatic transferring apparatus under control of a computer system. Therefore, wafer samples can be taken easily and quickly by a simple operation of changing computer programs without relying upon the skilled operator.

Another embodiment of the wafer handling apparatus according to this invention will be described with reference to FIG. 6.

In wafer handling apparatus 50 according to a second embodiment of this invention, first opening 56 of case 55 is covered by front face portion 51a when drawer 51 is pushed into case 55. Drawer pull 52 attached to front face portion 51a is used to pull out drawer 51 together with carrier 53. Storage room 54 is provided on case 55 of wafer handling apparatus to accommodate a plurality of wafers 16.

According to the above second embodiment, opening 56 of case 55 is closed by drawer 51 when not in use, thus effectively preventing the entry of dust into the machine.

Any apparatus according to the invention, which has been described, can take wafers out of the cassette, one by one, whether the wafers are inspected ones or uninspected ones.

Moreover, any apparatus according to the invention which has been described, can transfer not only semiconductor wafers, but also any other plate-like objects such as printed circuit boards or liquid crystal display panels.

The present invention can apply not only to a wafer probing machine, but also to a heat treatment apparatus (e.g., a dry-etching apparatus, a batch-type CVD apparatus, or an thermal diffusion apparatus), an ion-injecting apparatus, and a resist coating/developing apparatus.

The advantages of this invention will be described in the following:

A wafer carrier according to this invention is suitable for manual transfer in sampling or individual inspection of wafers. Above all, since a carrier is drawn out together with a wafer, a wafer can be transferred by manual operation without directly touching the wafer by hand and, therefore, the wafer is not contaminated. In other words, the wafer carrier according to this invention is suited for manual transfer of wafers from one apparatus to another and can serve as a work interface.

The handling apparatus for wafer carriers according to this invention allows safe and quick sampling of wafers from the wafer probing machine or LCDs from the LCD probing machine one by one.

The probing machine equipped with a handling apparatus for wafer carriers according to this invention allows safety guides sampling wafers one by one without using forceps and, therefore, provides no chances of a wafer falling or colliding with a member of machine. Hence, it is possible to prevent wafers from being damaged during sampling.

What is claimed is:

1. A water probing machine fitted with a handling apparatus for a wafer carrier, comprising:
   a testing section where a multitude of probes are brought into contact with the pads of a device circuit of semiconductor wafers to pass an electric current to the device circuit under test;
   a loading/unloading section provided adjacent to said testing section, for automatically taking the semiconductor wafers into and out of said testing section one after another; and
   means for transferring the semiconductor wafers between said loading/unloading section and said testing section, and
   including:
   a sampling case mounted to said loading/unloading section and having formed therein a first opening communicating with the outside of said loading/unloading section and a second opening communicating with the interior of said loading/unloading section;
   a drawer adapted to go into and out of said sampling case through the first opening;
   means for guiding said drawer between the first opening and the second opening of said sample case;
   a carrier which is loaded on said drawer and used to hold one semiconductor wafer at a time comprising:
   a tray means for loading thereon the semiconductor wafer submitted to processing, said tray means having a groove which is formed therein for unloading the semiconductor wafer therefrom; and
   means for positioning said tray means relative to a predetermined location of the drawer,
   whereby, when the carrier having the semiconductor wafer mounted thereon is inserted into the sampling case through the first opening, only the semiconductor wafer is transferred to the loading/unloading section through the second opening by the transferring means.

2. The machine according to claim 1, wherein said tray means have stepped sections constituting a plurality of concentric wafer-mounting surfaces located at different levels.

3. The machine according to claim 1, wherein said groove extends from a peripheral edge of said tray means to at least a central portion of said tray means.

4. The machine according to claim 2, wherein said groove extends to a location lower than the lowest wafer-mounting surface.

5. The carrier according to claim 1, wherein said positioning means includes a plurality of tapered openings formed in the reverse side of said tray means.

6. The machine according to claim 1, wherein the first opening and the second opening of said sampling case face each other.

7. The machine according to claim 1, wherein said drawer comes into contact with a stopper provided in said sampling case when it is drawn out and is thereby stopped.

8. The machine according to claim 7, wherein the stopper is a ball-catch clamp

9. The machine according to claim 7, wherein the stopper has a position adjusting function to vary its position of contact with said drawer.

10. The machine according to claim 1, wherein said wafer carrier has carrier-positioning means on the reverse side of said tray means.

11. The machine according to claim 10, wherein a pin on said drawer fits into a hole of a tapered area on the reverse side of the tray means of the carrier, whereby the carrier is held at a specified position relative to said drawer.

12. The machine according to claim 1, wherein said means for guiding said drawer has guide-rollers.

13. The machine according to claim 12, wherein there are provided a pair of guide-rollers to hold said drawer across the depth and another pair of guide-rollers to hold said drawer across the width.

14. The machine according to claim 12, wherein said drawer has formed on its reverse side a recess, into which a guide-roller pressurized by a coil spring provided on the case will fit when said drawer is drawn out.

15. The machine according to claim 1, wherein said drawer is fitted on its rear side with a stopper, which is held back by a part of the case when said drawer is drawn out, thus causing said drawer to stop at a specified, drawn-out position.

16. The machine according to claim 1, wherein said drawer has formed at its front portion a long groove which serves as a catch for use in manual operation.

17. The machine according to claim 1, wherein the front portion of said drawer defines a L-like configuration in the longitudinal cross section, the L-like bent portion of said drawer being capable of closing the first opening of the case when said drawer is pushed in.

* * * * *